(12) United States Patent
Grella et al.

(10) Patent No.: US 7,958,464 B1
(45) Date of Patent: Jun. 7, 2011

(54) ELECTRON BEAM PATTERNING

(75) Inventors: Luca Grella, Gilroy, CA (US); Allen M. Carroll, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 425 days.

(21) Appl. No.: 12/199,922

(22) Filed: Aug. 28, 2008

Related U.S. Application Data

(60) Provisional application No. 60/970,560, filed on Sep. 7, 2007.

(51) Int. Cl.
*G06F 17/50* (2006.01)
(52) U.S. Cl. ........................................... 716/55
(58) Field of Classification Search .................. 716/55
See application file for complete search history.

(56) References Cited

U.S. PATENT DOCUMENTS

| | | | |
|---|---|---|---|
| 7,106,490 B2 * | 9/2006 | Sandstrom | 359/290 |
| 7,245,352 B2 * | 7/2007 | Borodovsky et al. | 355/67 |
| 2006/0141376 A1 * | 6/2006 | Levy et al. | 430/30 |

* cited by examiner

*Primary Examiner* — Jack Chiang
*Assistant Examiner* — Brandon W Bowers
(74) *Attorney, Agent, or Firm* — Luedeka, Neely & Graham, P.C.

(57) ABSTRACT

A method for creating an electron beam pattern exposure, where a pattern of shapes is generated, including at least one of lines and vias. To each shape there is assigned a set of exposure pixels and edge placement constraints. An intensity at each exposure pixel is calculated by using a simplex method, and a latent resist image location is calculated by convolving a proximity function with the pixel intensities. A shape critical dimension and a shape edge slope is statistically evaluated by applying linear regression on the locations of the calculated latent image. The electron beam pattern exposures are produced using dosages linearly optimized on a rotated pixel grid to produce the shape critical dimension and the shape edge slope.

2 Claims, 3 Drawing Sheets

ELECTRON BEAM PATTERNING

This application claims all rights and priority on U.S. provisional patent application Ser. No. 60/970,560 filed Sep. 7, 2007.

FIELD

This invention relates to the field of integrated circuits. More particularly, this invention relates to patterning integrated circuits.

BACKGROUND

Integrated circuits are fabricated using photolithographic techniques, where an image is exposed and patterned into a layer of photoresist, and then either an underlying layer is modified in some manner, or an overlying layer is formed, with sections being lifted off with the removal of the photoresist. This basic patterning step is repeated over and over again, until the integrated circuit is completed. As the term is used herein, integrated circuit includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

As the size of integrated circuits continues to decrease, new problems are encountered—or known problems become more severe, and new methods must be developed. For example, features sizes are reducing to the point where the exposing wavelengths of light need to be reduced, because the feature sizes are smaller than the larger wavelengths that had been used in the past. Such small feature sizes tend to require a mask that is highly engineered. Whereas in times past a mask could be formed having opaque features of the same size and shape as those desired to be printed onto the integrated circuit substrate, masks for the smaller features sizes need to account for a wide variety of edge and other effects in blocking and passing the radiation that is used to expose the photoresist.

What is needed, therefore, are new methods and equipment that permit a fine control to be applied to the exposure of such small feature size structures.

SUMMARY

The above and other needs are met by a method for creating an electron beam pattern exposure, where a pattern of shapes is generated, including at least one of lines and vias. To each shape there is assigned a set of exposure pixels and edge placement constraints. An intensity at each exposure pixel is calculated by using a simplex method, and a latent resist image location is calculated by convolving a proximity function with the pixel intensities. A shape critical dimension and a shape edge slope is statistically evaluated by applying linear regression on the locations of the calculated latent image. The electron beam pattern exposures are produced using dosages linearly optimized on a rotated pixel grid to produce the shape critical dimension and the shape edge slope.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

The various methods according to the present invention use a gray-level technique that performs accurate placement of the edges of an imaged element by adjusting the exposure intensity, as opposed to adjusting the pixel size of the exposure element. These methods are especially well-suited for an exposure system that has a fixed pixel size and a rotating stage.

The methods make use of a linear programming technique that programs the exposure dosages so as to optimize a linear performance measure, while maintaining constraints on the applied dosages and on the intensities absorbed by the photoresist. The exposure pixels have a pitch that is oriented at an arbitrary angle. By applying these methods, the latitude in the intensity that is used for the resulting exposure is optimized for a given angle.

In the case of vertical lines (such as gate and metal layers) the exposure latitude is generally optimized at an angle of about forty-five degrees, and in the case of vias, the grid angle has no apparent effect on the exposure latitude.

Control Points

Figure 1:
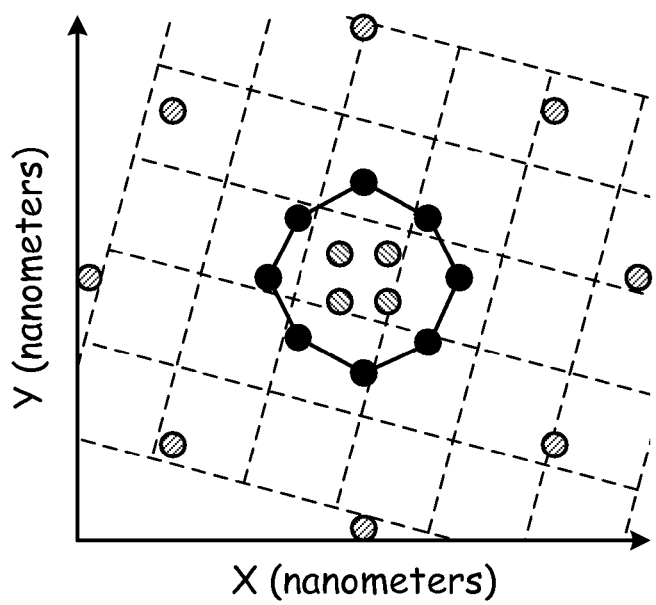
FIG. 1 is a chart of control points in a 32 nanometer via exposure, where the grid represents a 16 nanometer pixel array.

The simplex method is adopted herein as the linear programming technique. In a simplex-based dosage calculation, the constraints on the absorbed exposure are determined by assigning to each shape a set of control points. Control points are used to evaluate the exposure, or in other words, to set up the right hand side of the linear programming equation. FIG. 1 depicts the control points in a 32 nanometer via exposure mask, where the grid represents a 16 nanometer pixel array.

FIG. 1 shows how the control points are assigned to a via. The via is represented as an octagon, where each vertex of the octagon is a control point that sets the constraints for the edge placement. At these vertices locations, the exposure is set to equal the resist threshold dosage, which in the calculation is normalized to one. These vertices points are called edge control points. The inner positions determine the constraints for the exposure inside the via. These points are called bulk control points, and they fix the constraints for the exposure inside the via, which is set to exceed the resist threshold. This constraint is set as an inequality with a lower limit.

The points outside of the octagon control how the exposure vanishes outside of the boundaries of the via. These control points are called slope control points, and their constraints on the exposure is expressed as an inequality with a lower limit.

Figure 2:
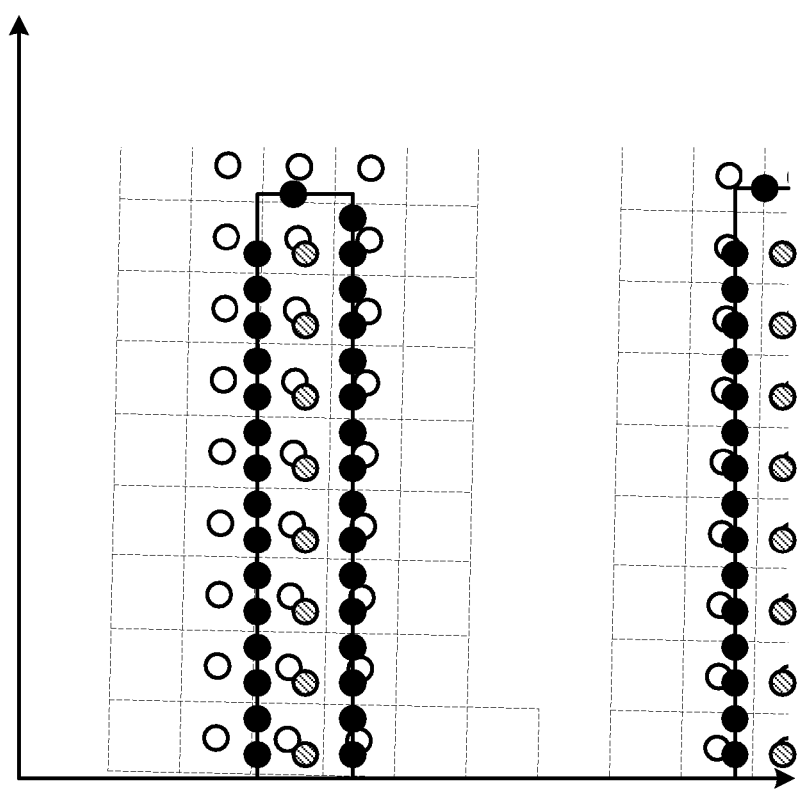
FIG. 2 is a chart of control points for 21 nanometer gates, where slope control points are not used.

Since the slope around the edge is mainly determined by the blur, these points are mostly ineffective in setting constraints on the exposure latitude. However, they are still used when it is desirable to avoid the optimization, so as to seek a solution outside the shape boundary and to make unfeasible a calculation that would be below a fixed exposure latitude width. FIG. 2 shows the layout of control points on 21 nanometer gates. In the depiction of FIG. 2, slope control points are not used. FIGS. 1 and 2 also show that the control points are grid independent. In FIG. 2, the dots centered in the grid are exposure pixels.

Pixels

The unknown parameters in the simplex method are the normalized intensities of the pixels. In order to create an optimization figure, it is sufficient to sort the pixels into three different categories, being (1) the bulk pixels, which are those that are contained within the shape, (2) the edge pixels, which are those whose boundaries intersect the edge, and (3) the outer pixels, which are those disposed outside of the boundaries of the shape. Those pixels whose distance outside of the shape is less than half of a pixel away from the boundary edge of the shape, and those pixels that are touching the edge pixels are considered to be edge pixels, and are included in the calculation.

Proximity Function

Figure 3:
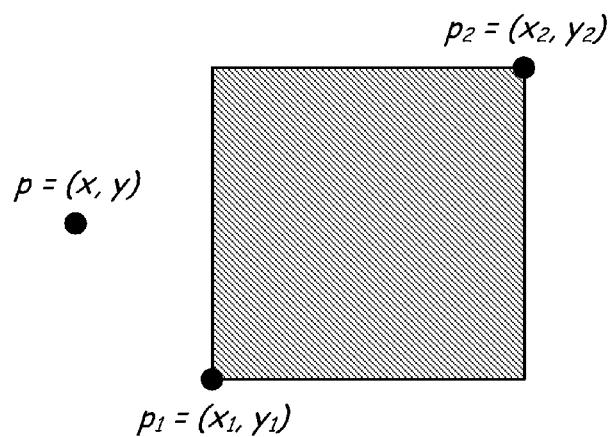
FIG. 3 depicts an exposure pixel, where the point p(x,y) is the location where the exposure is evaluated.

FIG. 3 represents an exposure pixel. The point p(x,y) is the location at which the exposure is evaluated. An exposure pixel can be defined by two points p1 and p2 as depicted in FIG. 3. If p(x,y) is the location where the exposure is evaluated, then the exposure intensity at that location is given by equation 1 below:

$$f_i(x, y; x_1, y_1, x_2, y_2) = \frac{1}{2} erf\left(\frac{x-x'}{\sqrt{2}\,\sigma_i}\right)\bigg|_{x_1}^{x_2} erf\left(\frac{y-y'}{\sqrt{2}\,\sigma_i}\right)\bigg|_{y_1}^{y_2} = \frac{1}{\pi\sigma^2}\int_{x_1}^{x_2}\int_{y_1}^{y_2} e^{-(x-x')^2/2\sigma_i^2}\cdot e^{-(y-y')^2/2\sigma_i^2}\, dx'\, dy'$$

In equation 1, $\sigma$ is the optics blur and the $(x_1, x_2, y_1, y_2)$ coordinates represent one pixel. Any pixel can be identified by an integer, so equation 1 can be simplified and rewritten in a more convenient form by defining:

$$f_x(x,i;\sigma) = erf((x-l-x_i)/\sqrt{2}\sigma) + erf((l-x-x_i)/\sqrt{2}\sigma),$$

then $$F(p, pixel_i; \sigma) = \frac{1}{2} f_x(x, i; \sigma) \cdot f_y(y, i; \sigma),$$

where $x_i, y_i$ are the coordinates of the center of the pixel, and 2l is the effective pixel size. The function $F(p,pixel_i;\sigma)$ is therefore the effect of the exposure of the pixel on the point p(x,y). To include other contributions to the exposure spread, we can build a function $F(p,pixel_i)$ that is expressed as a linear combination of terms having the proper $\sigma$ and weight $\eta$, where each term is related to a different phenomenon. Including the backscattering contribution to the exposure yields equation 2:

$$F(p, pixel_i) = \frac{F(p, pixel_i; \sigma_{blur}) + \eta \cdot F(p, pixel_i; \sigma_{back})}{1+\eta}.$$

This function represents the exposure at a point p(x,y), when a pixel $pixel_i$ of size 2l is activated. The function includes the effect of the blur and backscattering from the substrate. This function is used to evaluate the exposures in the linear programming method. In some embodiments, the linear dimension of the area over which the integral is performed is set to about ninety percent of the pixel size, to account for the electrical insulation between pixels.

Linear Problem Statement

The linear programming problem is expressed by a set of inequalities (equation 2), where the unknown parameters are the pixel intensities, or in other words the dosages $I(p_i)$. The sum is performed over the repeated indexes. A term $B(p_j)$, representing the effect of the background exposure resulting from full pattern coverage, is subtracted from the right hand side, yielding equations 3, which are a set of linear equations for edge, slope, and bulk points:

$$\sum^{NE} F(p_j, pixel_i) \cdot I(pixel_i) = 1 \pm 0.5 \cdot \varepsilon - B(p_j) \cdot \bar{I}$$

$$\sum^{NS} F(p_j, pixel_i) \cdot I(pixel_i) < I_s - B(p_j) \cdot \bar{I}$$

$$\sum^{NB} F(p_j, pixel_i) \cdot I(pixel_i) > 1 - B(p_j) \cdot \bar{I}$$

$$0 \leq I(pixel_i) \leq \text{MaxD}$$

Each row of equation set 3 describes the effect of the overall exposure on the $p_j$ control point. $\bar{I}$ is the average dosage to account for the background exposure given by the long range effects of equation set 3. For a given $\eta$, the average dosage depends mostly on the pattern density.

The first set of inequalities in equation set 3 above determines the exposure condition at the edge control point, with a tolerance of $\varepsilon=10^{-4}$. The second set determines the exposure at the slope control points, when used, and the third set specifies the exposure required at the bulk control points so as to exceed the resist threshold.

The equations of set 3 are really linear constraints where, in linear programming, the control points (rows) are also called auxiliary variables, and the pixel intensities (columns) are the structural variables. The structural variables (dosages) must fulfill the last inequality, where the dosages cannot exceed a given MaxD, which is determined by the clock speed and the beam current, and which also sets a blur and an energy spread value. Furthermore, the dosages cannot be negative.

Cost Function

To solve the optimization problem using the simplex method, a cost figure that measures the system performance is defined as follows:

$$F = \Sigma A_i \cdot I(pixel_i).$$

The figure F is minimized so that the total current through the system is minimized. The coefficients are defined as A=1 for pixels inside the structure, A=2 for edge pixels, and A=100 for pixels laying outside the feature. This choice of coefficients makes it more expensive to seek a solution that exposes regions outside of the shape, thus optimizing the exposure latitude. The goal of this cost function can be summarized as minimizing the beam current and optimizing the exposure latitude.

The calculations are evaluated by performing the convolution of the calculated pixel intensities with the proximity function. For a given point p(x,y) the convolution is given by the equation below, where $I(pixel_i)$ is the discretized intensity:

$$F(x,y)=F(p)=\Sigma_i F(p, pixel_i) \cdot I(pixel_i)$$

By sampling n $y_i$ values with n F(x) intensity profiles, each of them containing line edges, the edge is placed at the coordinate $x_0$ where $F(x_0)=1$. To calculate the edge coordinate, the intensity profile is fit with a line by performing a linear regression in a small interval dx around $x_0$, where F(x) behaves linearly. This interval is defined as the range of x values where the intensity profile changes by about ten percent, as described in the equation below:

$$1-0.05 \leq F(x_0 \pm dx) \leq 1+0.05.$$

In this interval, the edge coordinate is given by $$x_0 = \frac{1-y_0}{m},$$

where $y_0$ and m are given by the linear regression data of the intensity profile F(x). This procedure not only gives the edge location and the critical dimension value, but also the exposure latitude $l_{cd}$, which is derived from the slope m, as used below:

$$l_{cd} = \frac{0.06}{m}.$$

In this equation, $l_{cd}$ represents how many nanometers the line width changes when changing the exposure by about three percent. The $l_{cd}$ defined in this manner is also used to quantify the exposure.

Software Embodiment

An example of the method as embodied in a generic software program is now presented. In this example, several different sections of code are described. It is appreciated that the actual code used to implement the method can be varied according to individual circumstances. It is also appreciated that the sections could be rearranged or otherwise modified in other embodiments of the software.

The first section defines the absorbed dosages by each feature. The tolerance determines the accuracy within which the latent image is at threshold at the edge coordinate specified by the edge control point. MinBulkValue and MaxBulkValue keywords determine the interval of absorbed dosages inside the feature at the locations specified by the bulk control points. This interval is useful for larger features (such as a metal layer), where it is used to ensure an exposure that is as uniform as possible. The MinBulkValue, MaxBulkValue interval is less useful for fine features like gates and vias.

The second section determines the interval within which the solution is sought. The lower the MaxDosage is, the higher will be the number of the exposed pixels and the lower will be the process latitude. On the other hand, a lower MaxDosage is important to minimize the illumination current, and should be traded with the exposure latitude.

Section 3 defines parameters for shape pixel assignment. All the pixels inside and crossing the feature boundaries are added to the variable list. NumberOfNearPixels is an integer that adds to each assigned pixel the specified number of nearest neighbors. For example, when NumberOfNearPixels is one, all the nearest eight neighbors (one for each vertex and one for each side) will be added. In contract, DistanceOfNearPixels adds pixels whose distance from the feature is less than the one specified (in pixel size units).

Section 4 determines the frequency of control points, or the number of control points per pixel. The higher the control point frequency the more the system will be constrained. When the system is over-constrained, the number of exposed pixels increases, affecting the exposure latitude.

Section 5 contains the pattern definition. When the Via keyword is present, the generated pattern will be an array of Nx by Ny vias with an Lx width and a pitch vector (Dx, Dy). The pixel size is set by Dp, the rotation angle is set by Angle, and the offset vector by Offset, followed by x and y. When the Via keyword is not specified, the structures will be rectangles with an Lx and Ly sides length (in nanometers). When Ny is set to 1, then the corresponding pitch is also set to be equal to the corresponding line width. For example, with Ny set to 1, Ly is set equal to Dy, with the same being done for Nx.

Section 6 contains the double Gaussian parameters and the expected average dosage that is read after the keyword Avg-Dosage. This last number is used to properly account for the background exposure resulting from an infinite exposure. In order to estimate this number, a first run is performed with an average dosage set to zero, and then the average dosage that is written in the output is used (see next section). The ideal would be to have input and output average dosages to be the same. However, about a ten percent difference can be tolerated.

In section number 7, ConvSide specifies the size in nanometers of the square where the two-dimensional convolution is performed. The two-dimensional convolution is output for diagnostic reasons only.

Section number 8 performs the statistics on critical dimension and slope. In order to have a statistical sample of critical dimensions and slopes, the program calculates an intensity profile in the x direction, with a width of TestSideX nanometers centered on the pattern. Unless the Via keyword has been used, the program takes TestSideN intensity profiles, spanning over a TestSideY width.

Figure 4:
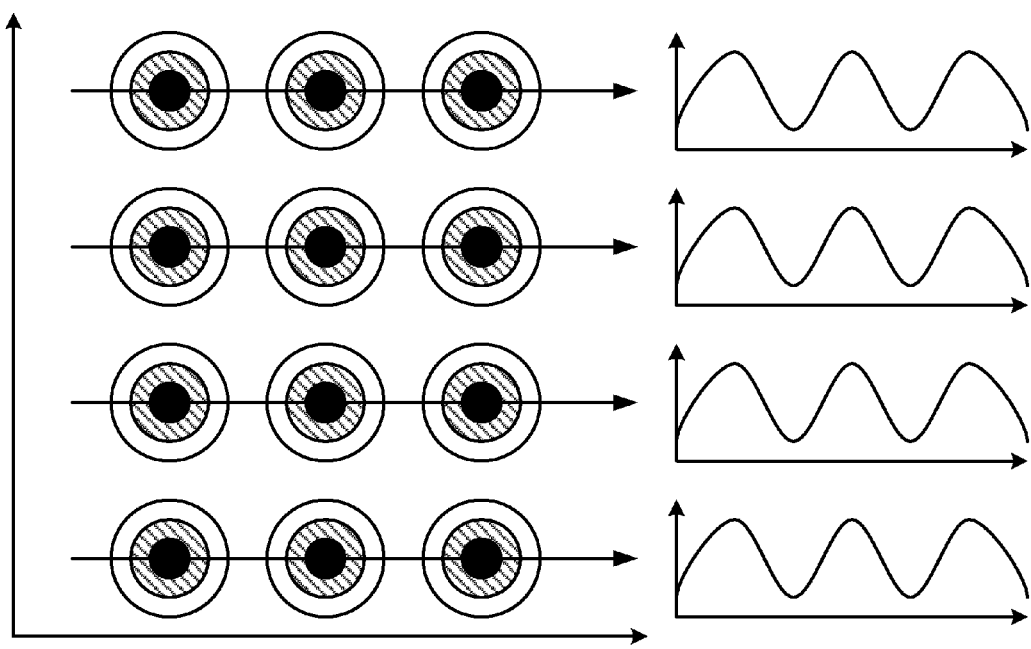
FIG. 4 is a plot of an intensity profile layout for exposed vias, where the number of line-scans used to build the statistics is taken from the input data.
Figure 5:
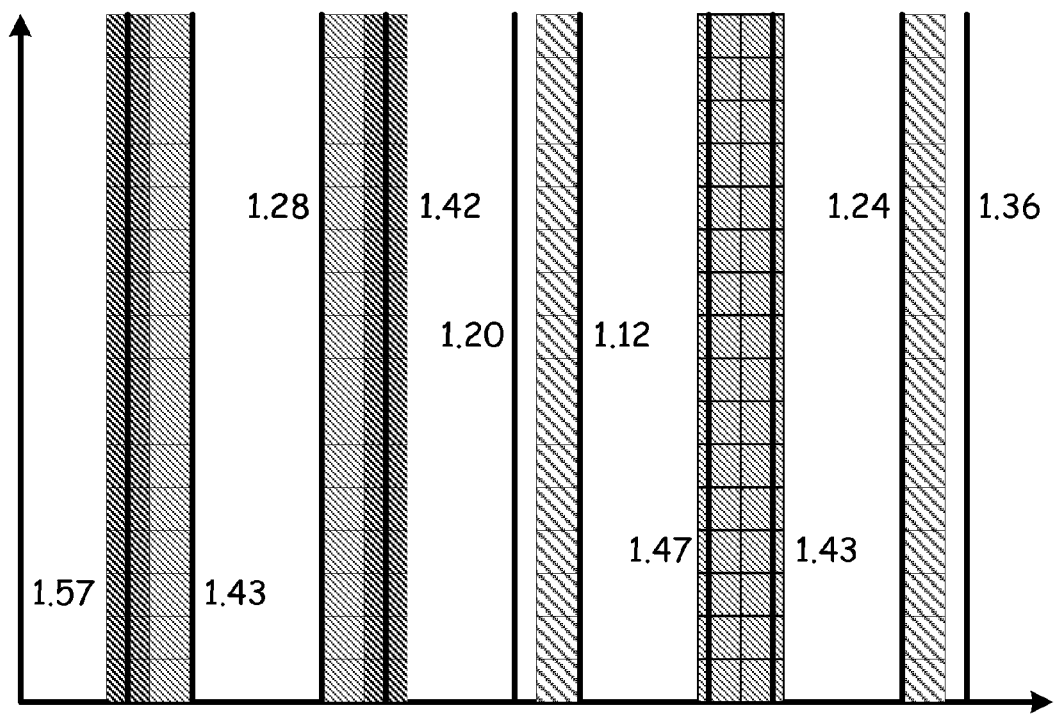
FIG. 5 is a depiction of a zero degree gray level distribution, where the boundary lines represent gate edges, and the number near each edge represents the slope (exposure latitude).

In the case where the Via parameter is employed, these last two keywords are ignored, because the program uses all the Ny locations already specified by the pattern sections. FIG. 4 shows how this operation is performed for an array of via elements, where the intensity changes across the cross section of each of the vias. This is depicted in the chart on the left by each via having three different intensity levels as represented by annular circles with different fill patterns, where the center has the highest intensity. This is also depicted in the charts on the right by showing a graph for each scan line, indicating the oscillation of intensity as the scan line moves across the via array pattern. It is appreciated that in actual implementation, more than three different intensity levels might be used. Three levels are depicted in the chart on the left so as to not unduly complicate the drawing.

Finally, a summary directory and a summary file name are specified, where the summary file contains all of the averaged data for a single run.

Pixel Grid

Figure 6:
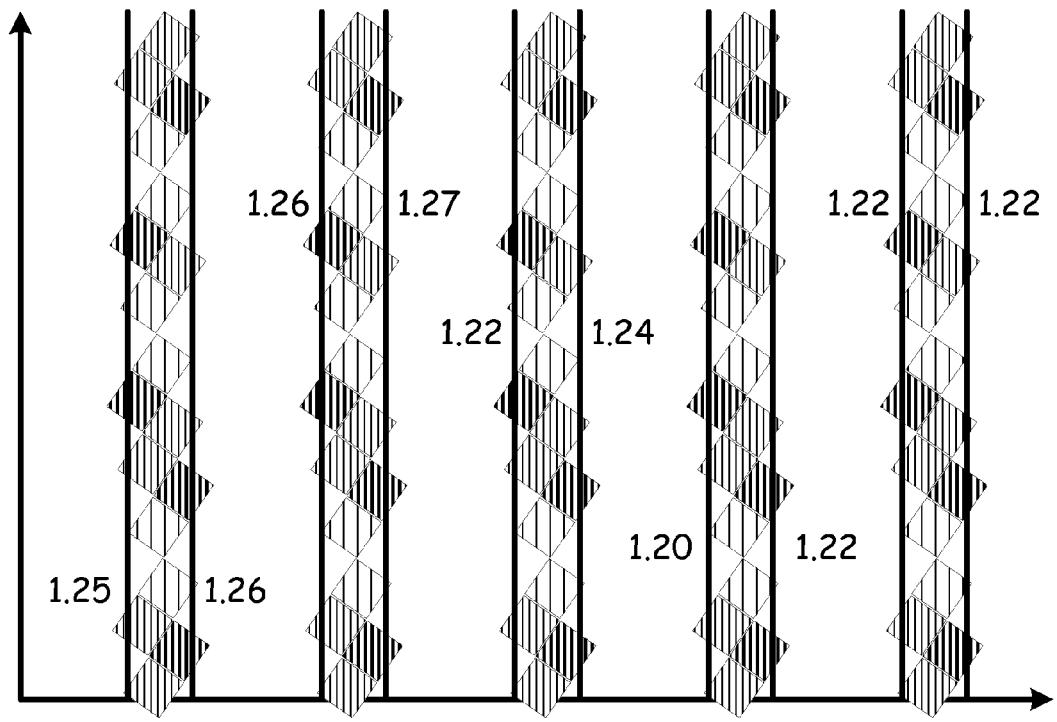
FIG. 6 is a depiction of a thirty-five degree gray level distribution, where the boundary lines represent gate edges, and the number near each edge represents the slope (exposure latitude).

A rotated grid behaves like an array of pixels with a dual pitch. This property helps in maintaining the exposure latitude down to acceptable values. FIG. 6. depicts an optimized exposure of an array of gate lines at the 32 nm node using an orthogonal grid. By comparing FIG. 6 to FIG. 7 it can be seen that the exposure latitude is better for the case as depicted in FIG. 7, with pixels disposed at about thirty-five degrees. While in the orthogonal grid of FIG. 6 the edge is always defined by exposing two pixels, in a rotated grid, such as in FIG. 7, this number can always be less, regardless of the absolute position of the gate on the grid itself, while still sufficient to define the edge position.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A processor-based method for creating an electron beam pattern exposure, the method comprising the steps of:
    generating with the processor a pattern of shapes, including at least one of lines and vias,
    assigning to each shape a set of exposure pixels and edge placement constraints,
    calculating with the processor an intensity at each exposure pixel by using a simplex method,
    calculating with the processor a latent resist image location by convolving a proximity function with the pixel intensities,
    statistically evaluating with the processor a shape critical dimension and a shape edge slope by applying linear regression on the locations of the calculated latent image, and
    producing with the processor the electron beam pattern exposures using dosages linearly optimized on a rotated pixel grid to produce the shape critical dimension and the shape edge slope.

2. A program on a non-transitory computer readable medium, the program operable to instruct a computer to create an electron beam pattern exposure, the program implementing a method comprising the steps of:
    generating a pattern of shapes, including at least one of lines and vias,
    assigning to each shape a set of exposure pixels and edge placement constraints,
    calculating an intensity at each exposure pixel by using a simplex method,
    calculating a latent resist image location by convolving a proximity function with the pixel intensities,
    statistically evaluating a shape critical dimension and a shape edge slope by applying linear regression on the locations of the calculated latent image, and
    producing the electron beam pattern exposures using dosages linearly optimized on a rotated pixel grid to produce the shape critical dimension and the shape edge slope.

* * * * *